United States Patent
Kazama et al.

(10) Patent No.: US 7,064,001 B2
(45) Date of Patent: Jun. 20, 2006

(54) METHOD OF PRODUCTION OF SEMICONDUCTOR MODULE WITH EXTERNAL CONNECTION TERMINAL

(75) Inventors: Youichi Kazama, Nagano (JP); Keiichi Masaki, Nagano (JP)

(73) Assignee: Shinko Electric Industries Co., Ltd., Nagano (JP)

(*) Notice: Subject to any disclaimer, the term of this patent is extended or adjusted under 35 U.S.C. 154(b) by 0 days.

(21) Appl. No.: 10/216,776

(22) Filed: Aug. 13, 2002

(65) Prior Publication Data

US 2003/0045084 A1 Mar. 6, 2003

(30) Foreign Application Priority Data

Sep. 3, 2001 (JP) .................................... 2001-265848

(51) Int. Cl.
*H01L 21/44* (2006.01)

(52) U.S. Cl. .................. 438/106; 438/612; 438/613; 438/666

(58) Field of Classification Search ............... 438/106, 438/121, 612–617, 411, 461, 666; 257/276, 257/41, 678, 735, 737, 779, 781, 786

See application file for complete search history.

(56) References Cited

U.S. PATENT DOCUMENTS 6,204,162 B1 * 3/2001 Yonemochi et al. ........ 438/612

FOREIGN PATENT DOCUMENTS

JP 59-208756 11/1984

* cited by examiner

*Primary Examiner*—Carl Whitehead, Jr.
*Assistant Examiner*—Yennhu B. Huynh
(74) *Attorney, Agent, or Firm*—Staas & Halsey LLP

(57) ABSTRACT

A method of production of a semiconductor module comprised of a semiconductor chip, external connection terminal pads for bonding with solder balls or other external connection terminals, wires electrically connecting the same, and a sealing resin layer sealing the semiconductor chip, external connection terminal pds, and wires, where surfaces of the external connection terminal pads are exposed at bottoms of recesses formed in the sealing resin layer, comprising sealing by a resin external connection terminal pads and soluble metal layers formed at surfaces of the metal substrate by electroplating to form a sealing resin layer at that one surface, then etching away the metal substrate and soluble metal layers to thereby form in the resin sealing layer recesses exposing the external connection terminal pads at their bottoms by a single etching process without requiring special etching stop control.

8 Claims, 6 Drawing Sheets

METHOD OF PRODUCTION OF SEMICONDUCTOR MODULE WITH EXTERNAL CONNECTION TERMINAL

BACKGROUND OF THE INVENTION

1. Field of the Invention

The present invention relates to a method of production of a semiconductor module, more particularly relates to a method of production of a semiconductor module wherein external connection terminal pads for bonding with solder balls or other external connection terminals are electrically connected with the semiconductor chip by wires and wherein surfaces of the external connection terminal pads are exposed at the bottoms of recesses formed in a sealing resin layer sealing the semiconductor chip, external connection terminal pads, and wires.

2. Description of the Related Art

Known in the art is a plastic package type semiconductor module 100 shown in FIG. 8. This semiconductor module 100 has external connection terminal pads 106 for bonding with solder balls 104 serving as external connection terminals and electrically connected with a semiconductor chip 102 by wires 108. A sealing resin layer 110 is formed for sealing the external connection terminal pads 106, semiconductor chip 102, and wires 108.

In this conventional semiconductor module 100, there is the defect that the external connection terminal pads 106 are exposed flush with the surface of the sealing resin layer 110 and so the bond strength of the solder balls 104 bonded to the exposed surfaces is low. This is because the shear stress and other stress applied to the solder balls 104 concentrates at the bonded surfaces between the solder balls 104 and external connection terminal pads 106.

To eliminate this defect, for example, as proposed in Japanese Examined Patent Publication (Kokoku) No. 4-47977, there is known the method of exposing the external connection terminal pads 106 at the bottoms of recesses formed in the sealing resin layer 110 and bonding the solder balls 104 at those exposed surfaces. Due to this, the shear stress and other stress applied to the solder balls 104 is dispersed to the inside walls of the recesses in addition to the bonded surfaces between the solder balls 104 and external connection terminal pads 106.

The above proposed method will be explained further with reference to FIG. 9A to FIG. 9E.

First, as shown in FIG. 9A, external connection terminal pads 202 each comprised of an Ni layer sandwiched between one Au layer and another Au layer and a semiconductor chip mount 204 are formed on one surface of a metal substrate 200 by plating.

Next, as shown in FIG. 9B, one surface of the metal substrate 200 is subjected to a first etching. The external connection terminal pads 202 and the semiconductor chip mount 204 are covered by Au layers and therefore are not etched and function as etching masks, so the portions of the metal substrate 200 under the external connection terminal pads and the semiconductor chip mount 204 are left as projections 206.

Next, as shown in FIG. 9C, the semiconductor chip 208 is placed on the semiconductor chip mount 204 and is electrically connected with the external connection terminal pads 202 by wires 210.

Next, as shown in FIG. 9D, the semiconductor chip 208, external connection terminal pads 202, and wires 210 are sealed by a resin to form the sealing resin layer 212.

Next, as shown in FIG. 9E, second etching is performed to remove the metal substrate 200. Due to this, the surfaces of the external connection terminal pads 202 are exposed at the bottoms of recesses 214 formed in the sealing resin layer 212. The recesses 214 are formed by removing the projections 206 formed at the surface of the metal substrate 200 due to the first etching by the second etching.

By bonding solder balls as external connection terminals to the surfaces of the external connection terminal pads exposed at the bottoms of the exposed recesses 214, it is possible to improve the bond strength between the solder balls and the external connection terminal pads 202.

The above conventional method, however, requires that the etching be performed twice, so the production process of the semiconductor module becomes complicated.

Further, the heights of the projections 206 formed by the first etching directly determine the depths of the recesses 214 formed in the sealing resin layer 212 in the end, so it is necessary to strictly control the etching stop in the first etching so that the heights of the projections 206 reach predetermined values. Therefore, it is necessary to strictly control the first etching process.

SUMMARY OF THE INVENTION

An object of the present invention is to provide a method of production of a semiconductor module enabling the formation, in a resin sealing layer sealing external connection terminal pads for bonding with solder balls or other external connection terminals, a semiconductor chip, and wires electrically connecting the same, of recesses exposing the external connection terminal pads at their bottoms by a single etching process without requiring strict control of the etching stop.

To attain the above object, the present invention provides a method of production of a semiconductor module comprised of a semiconductor chip, external connection terminal pads for bonding with solder balls or other external connection terminals, wires electrically connecting the same, and a sealing resin layer sealing the semiconductor chip, external connection terminal pads, and wires, where surfaces of the external connection terminal pads are exposed at bottoms of recesses formed in the sealing resin layer, the method comprising the steps of forming a resist layer on one surface of a metal substrate; patterning the resist layer to form recesses defining scheduled positions for formation of the external connection terminal pads and exposing the surface of the metal substrate at bottoms of the recesses; electroplating the surface using the metal substrate as a power feed layer to successively stack on the surface of the metal substrate exposed at the bottoms of the recesses soluble metal layers comprised of a metal soluble in an etching solution for etching the metal substrate and external connection terminal pads comprised of at least one metal layer including an insoluble metal layer comprised of a metal insoluble in the etching solution; removing the resist layer; placing a semiconductor chip on the metal substrate; electrically connecting the semiconductor chip and the external connection terminal pads by wires; forming a sealing resin layer sealing the semiconductor chip, the external connection terminal pads, and the wires on the surface of the metal substrate; and etching away the metal substrate and the soluble metal layer by the etching solution so as to form recesses exposing surfaces of the external connection terminal pads at their bottoms in the sealing resin layer.

Preferably, the soluble metal layer is formed by the same metal as the metal of the metal substrate.

Preferably, the external connection terminal pads are formed by successively stacking an insoluble metal layer comprised of Au, a Pd layer, an Ni layer, and a Pd layer.

Preferably, the metal substrate is comprised of at least one material selected from the group comprised of Cu, a Cu alloy, and an Fe—Ni alloy.

BRIEF DESCRIPTION OF THE DRAWINGS

These and other objects and features of the present invention will become clearer from the following description of the preferred embodiments given with reference to the attached drawings, wherein.

DESCRIPTION OF THE PREFERRED EMBODIMENTS

Figure 1A:
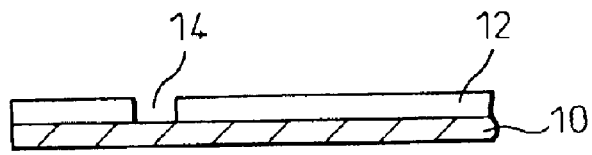
FIGS. 1A to 1F are sectional views of steps of a method of production of a semiconductor module according to an embodiment of the present invention.

According to the present invention, instead of the projections 206 which were formed by etching the metal substrate 200 in the prior art method, soluble metal layers able to dissolve in the etching solution for etching the metal substrate 200 are formed on the metal substrate by plating. Next, external connection terminal pads 202 comprised of metal insoluble in the etching solution are formed on the soluble metal layers by plating. Finally, the metal substrate 200 is etched, whereby it is possible to form in the sealing resin layer recesses exposing the external connection terminal pads at their bottoms by a single etching process without requiring strict control of the etching end.

The soluble metal layers are comprised of a metal soluble in the etching solution for etching the metal substrate. Due to this, the soluble metal layers are also removed all together by the etching process for removing the metal substrate and recesses having bottoms defined by the surfaces of the external connection terminal pads are formed in the sealing resin layer. If forming the soluble metal layers and metal substrate by the same metal, control of the etching process becomes easy. The material of the metal substrate is typically copper (Cu), but it is also possible to use for example a copper alloy such as MF-202, EFTEC64T, or CDA7025 or an Fe—Ni ally such as 42 Alloy.

The external connection terminal pads formed on the soluble metal layers comprised of Cu or other suitable metals include insoluble metal layers comprised of a metal insoluble in the etching solution for etching the metal substrate. When the soluble metal layers are etched by the etching solution for etching the metal substrate, the insoluble metal layers of the external connection terminal pads function as etching stoppers to automatically stop the etching when the soluble metal layers are completely etched, so no special control of the etching end is required.

The external connection terminal pads are preferably formed by successively stacking an insoluble metal layer comprised of Au, a Pd layer, an Ni layer, and another Pd layer. The external connection terminal pads obtained by this have surfaces for forming the external connection terminals by soldering comprised of Au, so good solder wettability is secured and simultaneously have wire bonding surfaces comprised of Pd, so good wire bondability is secured. The Au layer is generally formed extremely thin and ends up dissolving after providing the solder wettability. The thus appearing Pd layer forms an alloy with the solder to create a strong bond. The Ni layer acts as a barrier against alloying and stabilizes the formation of the topmost Pd layer.

In this way, according to the present invention, since it is possible to form recesses exposing external connection terminal pads at their bottoms in the sealing resin layer by a single etching process without requiring special control of the etching end, it is possible to produce a semiconductor module by a process streamlined from the prior art method.

Preferred embodiments of the present invention will be described in detail below while referring to the attached figures.

FIGS. 1A to 1F show steps in the method of production of a semiconductor module according to one embodiment of the present invention.

First, as shown in FIG. 1A, a resist layer 12 is formed on one surface of a metal substrate 10 comprised of Cu. The resist layer 12 is then patterned to form recesses 14 defining scheduled positions for formation of external connection terminal pads. The surface of the Cu substrate 10 is exposed at the bottoms of the recesses 14.

Figure 1B:

Next, as shown in FIG. 1B, the surface of the Cu substrate exposed in the recesses 14 is electroplated using the Cu substrate 10 as a power feed layer so as to plate metal soluble in the etching solution for etching the Cu substrate 10, specifically, the soluble metal layers 16 comprised of Cu.

Figure 1C:
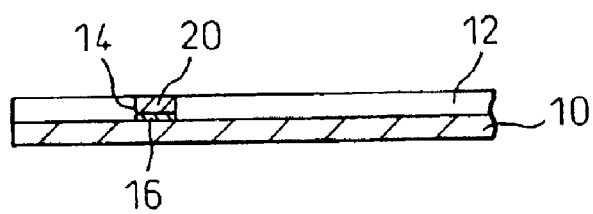

Further, as shown in FIG. 1C, the soluble metal layers 16 in the recesses 14 are electroplated using the Cu substrate 10 as a power feed layer to stack a plurality of metal layers and form the external connection terminal pads 20.

Figure 2:
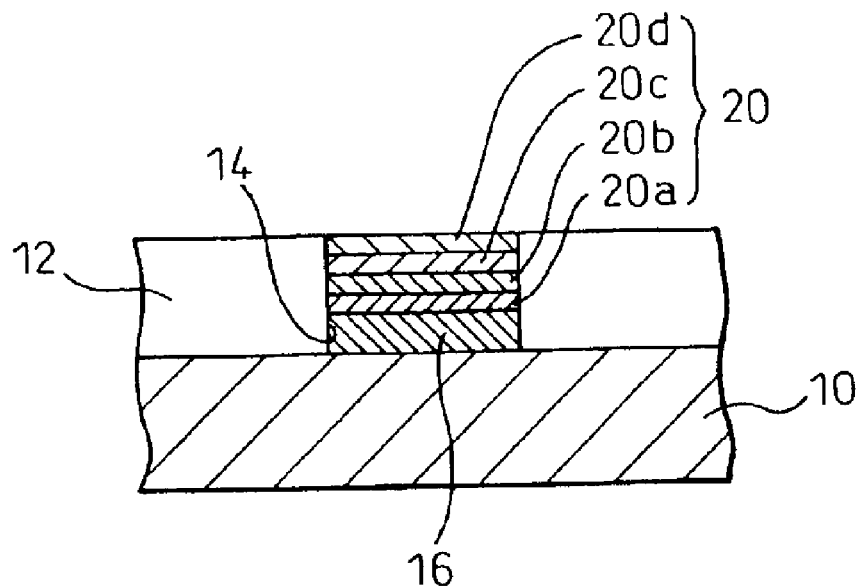
FIG. 2 is a partially enlarged sectional view of a layer configuration of a soluble metal layer 16 and an external connection terminal pad 20 formed in a recess 14 by the step of FIG. 1C.

FIG. 2 shows one example of the layers comprising the external connection terminal pads 20.

In the recesses 14, first Au layers 20a are formed on the Cu soluble metal layers 16 formed on the Cu substrate 10. The Au layers 20a are insoluble in an etching solution etching the Cu substrate 10 and Cu soluble metal layers 16 and function as etching stoppers. Further, the Au layers 20a have a high solder wettability. In the end, solder bonding surfaces (surfaces bonding with the solder balls) of the external connection terminal pads 20 are provided. The Au layers 20a need only function as etching stoppers and to provide surfaces with good solder wettability, so may be made extremely thin.

Next, Pd layers 20b are formed on the Au layers 20a. The Pd layers 20b alloy with the solder to achieve a high bond strength. That is, when soldering the external connection terminal pads 20, the extremely thin Au layers 20a dissolve and disappear while providing the solder wettability. The adjoining Pd layers 20b and solder contact each other and alloy to form strong bonds.

Further, Ni layers 20c are formed on the Pd layers 20b. The Ni layers 20c function as barriers to solder permeation. Due to this, the next formed Pd layer 20d is prevented from alloying with the solder.

Finally, Pd layers 20d are formed on the Ni layers 20c. The Pd layers 20d have good wire bondability and provide wire bonding surfaces at their tops.

Figure 1D:
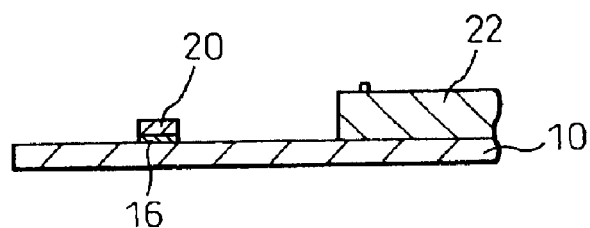

Next, in the step shown in FIG. 1D, the resist layer 12 is peeled off, then a semiconductor chip 22 is placed at a predetermined location on the Cu substrate 10.

Figure 1E:
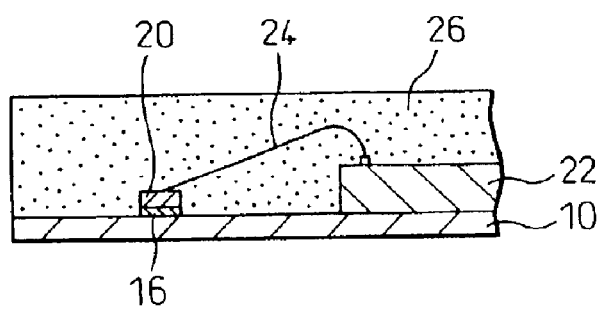

Next, as shown in FIG. 1E, the semiconductor chip 22 on the Cu substrate 10 and the external connection terminal pads 20 are electrically connected by wires 24, then the soluble metal layers 16 and the external connection terminal pads 20, wires 24, and semiconductor chip 22 are sealed by the sealing resin. This sealing can be performed by the known transfer molding method. As a result, a sealing resin layer 26 is formed on one surface of the Cu substrate 10.

Figure 1F:
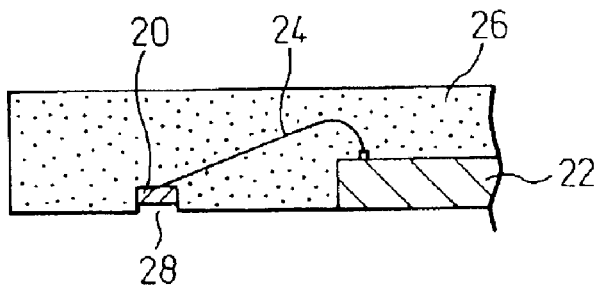

Next, as shown in FIG. 1F, the Cu substrate 10 and the Cu soluble metal layers 16 are etched away by the same etching solution, whereupon recesses 28 are formed in the sealing resin layer 26. The Au layers 20a of the external connection terminal pads 20 are exposed at the bottoms of the recesses 28.

When etching the Cu substrate 10 and the Cu soluble metal layers 16, the Au layers 20a serving as the insoluble metal layers function as etching stoppers and prevent over etching of the external connection terminal pads 20.

Figure 3:
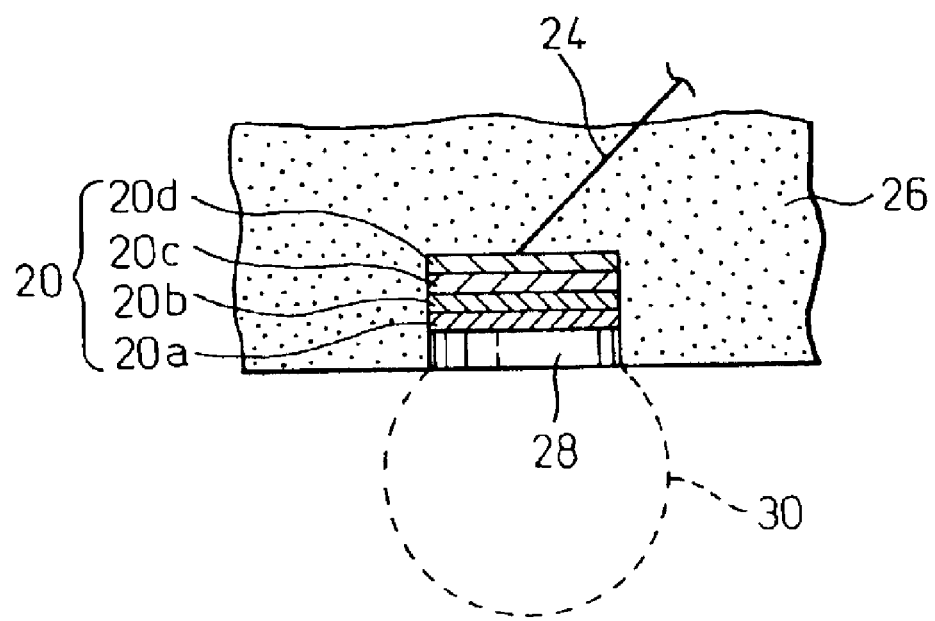
FIG. 3 is a partially enlarged sectional view of the structure of the external connection terminal pad 20 exposed at the bottom of a recess 28 formed in a sealing resin layer 26 formed at the step of FIG. 1F.

The bottom surfaces of the recesses 28 are defined by the Au layers 20a of the external connection terminal pads 20. As explained above, the Au layers 20a have good solder wettability. Therefore, as shown in FIG. 3, when bonding the solder balls 30 serving as the external connection terminals to the external connection terminal pads 20, the external connection terminal pads 20 and solder balls 30 can be bonded well.

With the method of production of a semiconductor module shown in FIGS. 1A to 1F, it is possible to form the soluble metal layers 16 and the external connection terminal pads 20 by forming the patterned resist layer 12 at one time and a single etching process is enough for the Cu substrate 10 and the Cu soluble metal layers 16. Therefore, the production process can be streamlined compared with the method of the related art shown in FIG. 9A to FIG. 9E.

Further, as shown in FIG. 1F, since one surface of the semiconductor chip 22 is exposed from the sealing resin layer 22, part of the heat generated by the semiconductor chip 22 is dissipated from that exposed surface.

Note that in the present embodiment, as shown in FIG. 2, the layer structure of the external connection terminal pads 20 was made a four-layer structure of Au/Pd/Ni/Pd in the order from the bottom up, but it is also possible to use another layer structure in accordance with need. For example, it is possible to use a three-layer structure of Au/Pd/Au, a two-layer structure of Au/Pd, and a single-layer structure of just Au.

Further, in the present embodiment, Cu was used as the material of the metal substrate 10, but it is also possible to use a material other than Cu such as a Cu alloy like MF-202, EFTEC64T, and CDA7025 or an Fe—Ni alloy such as 42 Alloy.

Figure 4:
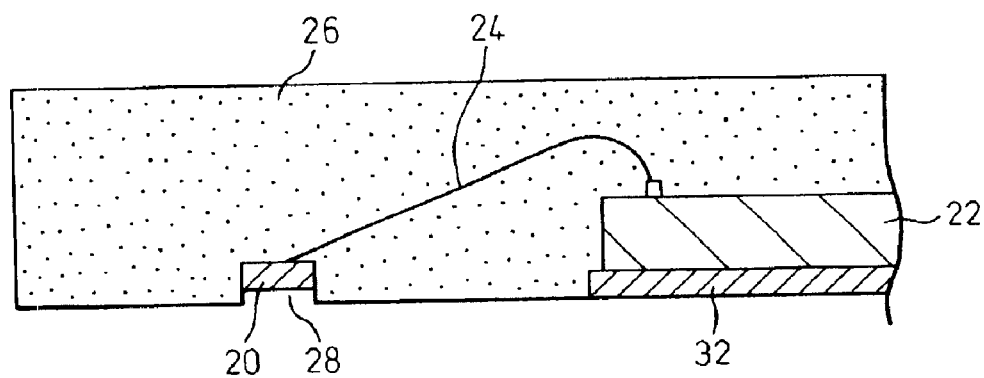
FIG. 4 is a partial sectional view of a semiconductor module obtained by a method of production of a semiconductor module according to another embodiment of the present invention.

According to another embodiment of the present invention, as shown in FIG. 4, it is possible to increase the dissipation of heat by forming a heat radiator 32 of an area larger than the surface of the semiconductor chip 22.

Figure 5A:
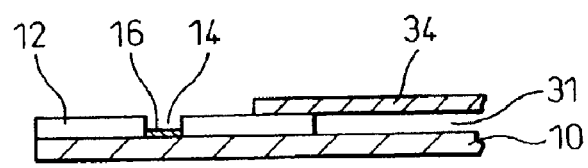
FIGS. 5A to 5C are sectional views of steps for forming the structure shown in FIG. 4.
Figure 5B:
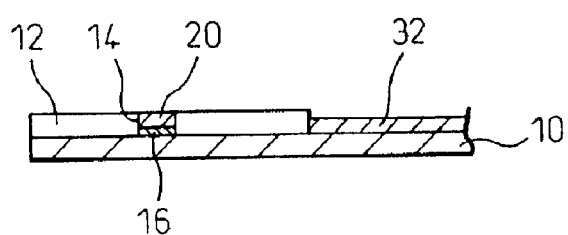
Figure 5C:
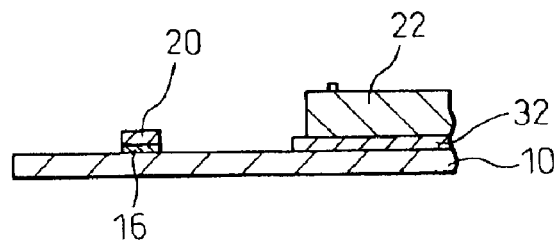

To form the heat radiator 32 of FIG. 4, the steps of FIGS. 5A to 5C are performed instead of the steps of FIGS. 1B to 1D.

As shown in FIG. 5A, the resist layer 12 is patterned to form recesses 14 exposing the surface of the Cu substrate 10 at their bottoms at scheduled positions for formation of the external connection terminal pads 20 and form a heat radiator recess 31 at the scheduled position for formation of the heat radiator 32.

Next, the heat radiator recess 31 is covered by a mask plate 34 and the surface is electroplated using the Cu substrate 10 as a power feed layer to form soluble metal layers 16 comprised of Cu in the recesses 14.

Next, as shown in FIG. 5B, the mask plate 34 is removed and the surface is electroplated using the Cu substrate 10 as a power feed layer to form the external connection terminal pads 20 on the Cu soluble metal layers 16 in the recesses 14 and simultaneously form the heat radiator 32 in the recess 31. The obtained heat radiator 32 has the same layer configuration as the external connection terminal pads 20.

Next, as shown in FIG. 5C, the resist layer 12 is removed and the semiconductor chip 22 is placed on the heat radiator 32.

After this, the same steps are performed as explained in FIGS. 1E to 1F, whereby a substrate comprised of the semiconductor chip 22 plus a radiator 32 as shown in FIG. 4 is obtained. In this case, the exposed surface of the heat radiator 32 is flush with the bottom surface of the resin sealing layer 26.

Figure 6:
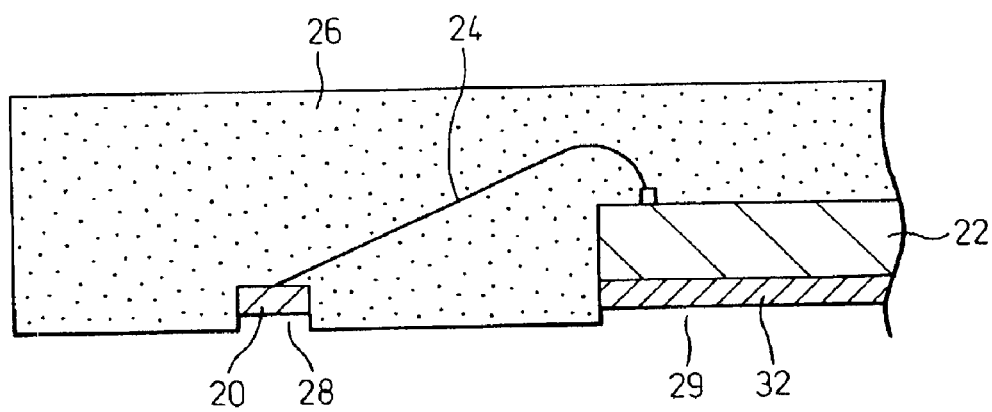
FIG. 6 is a partial sectional view of a semiconductor module obtained by the method of production of a semiconductor module according to still another embodiment of the present invention.

According to still another embodiment of the present invention, the exposed surface of the heat radiator 32 may also be sunk from the bottom surface of the sealing resin layer 26 as shown in FIG. 6. That is, the heat radiator 32 may also be exposed at the bottom of a recess 29 formed in the sealing resin layer 26.

Figure 7A:
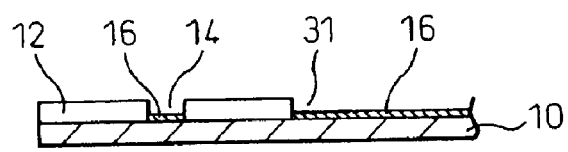
FIGS. 7A to 7C are sectional views of steps for forming the structure shown in FIG. 6.
Figure 7B:
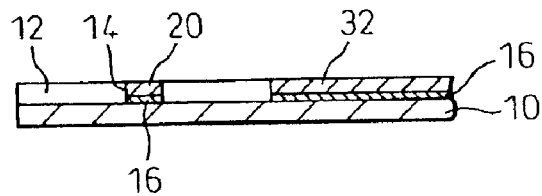
Figure 7C:
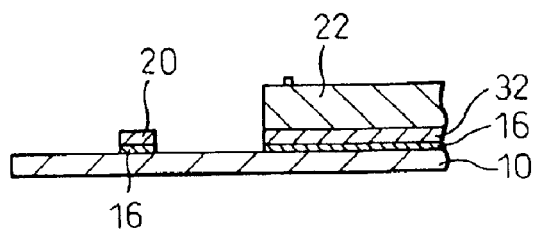
Figure 8:
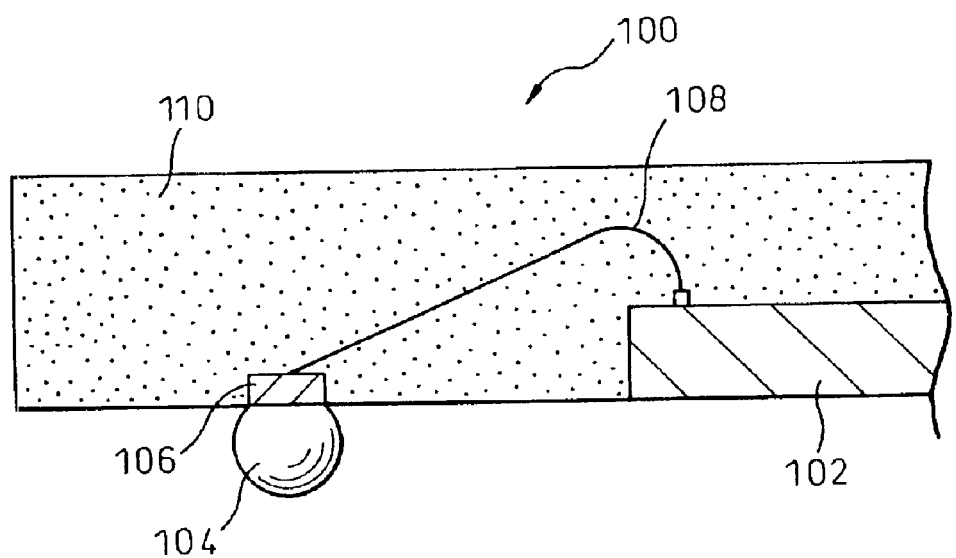
FIG. 8 is a partial sectional view of a semiconductor module of the related art.
Figure 9A:
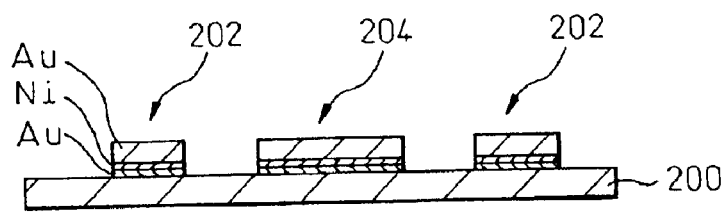
FIGS. 9A to 9E are sectional views of steps of a method of production of an improved semiconductor module according to the related art.
Figure 9B:
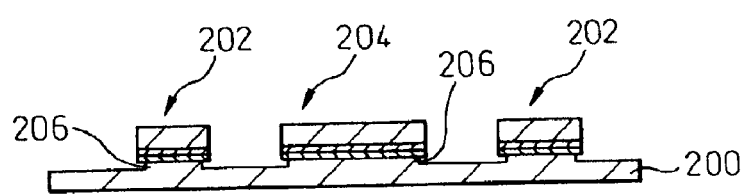
Figure 9C:
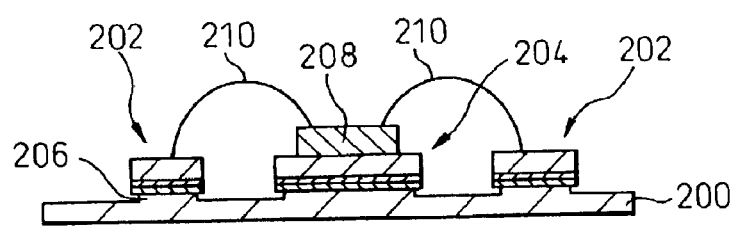
Figure 9D:
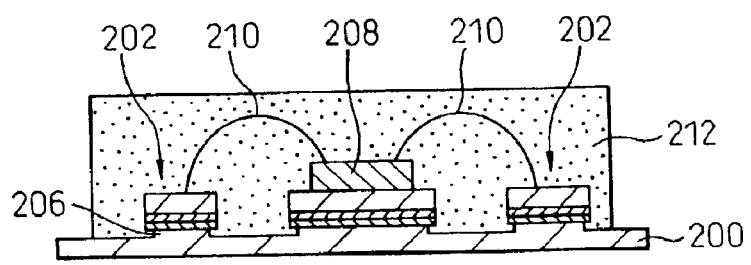
Figure 9E:
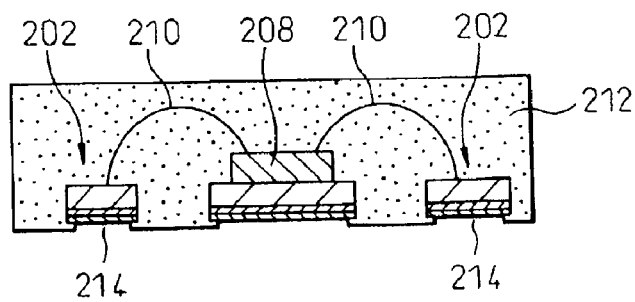

To form the heat radiator 32 of FIG. 6, the steps of FIGS. 7A to 7C are performed instead of the steps of FIGS. 1B to 1D.

As shown in FIG. 7A, the resist layer 12 is patterned to form recesses 14 exposing the surface of the Cu substrate 10 at their bottoms at scheduled positions for formation of the external connection terminal pads 20 and form the heat radiator recess 31 at the scheduled position for formation of the heat radiator 32.

Next, the surface is electroplated using the Cu substrate 10 as a power feed layer so as to form the Cu soluble metal layers 16 in the recesses 14 and the heat radiator recess 31.

Next, as shown in FIG. 7B, the soluble metal layers 16 are electroplated using the Cu substrate 10 as a power feed layer so as to form the external connection terminal pads 20 in the recesses 14 and simultaneously form the heat radiator 32 in the heat radiator recess 31. The obtained heat radiator 32 has the same layer configuration as the external connection terminal pads 20.

Next, as shown in FIG. 7C, the resist layer 12 is removed and the semiconductor chip 22 is placed on the heat radiator 32.

After this, the same steps are performed as explained in FIGS. 1E to 1F to obtain a structure comprised of the semiconductor chip 22 plus the heat radiator as shown in FIG. 6. In this case, the exposed surface of the heat radiator 32 is sunk from the bottom surface of the sealing resin layer 26.

As explained above, according to the present invention, by sealing with a resin the external connection terminal pads and soluble metal layers formed on one surface of the metal substrate and thereby forming a sealing resin layer on that surface, then removing the metal substrate and the soluble metal layers by etching, it is possible to form recesses exposing the external connection terminal pads at their bottoms in the sealing resin layer.

Therefore, in the present invention, it is enough to etch the metal substrate only once. Compared with the method of production of a semiconductor module of the related art which etches the metal substrate twice, it is possible to streamline the production process of the semiconductor module and possible to achieve a reduction in the manufacturing cost of the semiconductor module.

While the invention has been described with reference to specific embodiments chosen for purpose of illustration, it should be apparent that numerous modifications could be made thereto by those skilled in the art without departing from the basic concept and scope of the invention.

The present disclosure relates to subject matter contained in Japanese Patent Application No. 2001-265848, filed on Sep. 3, 2001, the disclosure of which is expressly incorporated herein by reference in its entirety.

What is claimed is:

1. A method of production of a semiconductor module comprised of a semiconductor chip, external connection terminal pads for bonding with solder balls or other external connection terminals, wires electrically connecting the same, and a sealing resin layer sealing the semiconductor chip, external connection terminal pads, and wires, where surfaces of the external connection terminal pads are exposed at bottoms of recesses formed in the sealing resin layer, comprising:

forming a resist layer on one surface of a metal substrate;
patterning said resist layer to expose portions of the metal substrate through openings in the resist layer for formation of said external connection terminal pads;
electroplating the surface of the metal substrate exposed through the openings using said metal substrate as a power feed layer to successively stack on the surface of the metal substrate metal layers comprised of:
  a metal soluble in an etching solution for etching said metal substrate; and
  external connection terminal pads comprised of at least one metal insoluble in said etching solution;
removing said resist layer;
placing a semiconductor chip on said metal substrate;
electrically connecting said semiconductor chip and said external connection terminal pads by wires;
forming a sealing resin layer sealing said semiconductor chip, said external connection terminal pads, and said wires on said surface of said metal substrate; and
etching away said metal substrate and said soluble metal layer by said etching solution to expose surfaces of said external connection terminal pads at their bottoms in said sealing resin layer and to form a bottom surface having recesses at locations of the external connection terminal pads, the recesses being formed by etching away said soluble metal layer.

2. A method of production as set forth in claim 1, wherein said soluble metal layer is formed by the same metal as the metal of said metal substrate.

3. A method of production as set forth in claim 1, wherein said external connection terminal pad is formed by successively stacking an insoluble metal layer comprised of Au, a Pd layer, an Ni layer, and a Pd layer.

4. A method of production as set forth in claim 1, where said metal substrate is comprised of at least one material selected from the group comprised of Cu, a Cu alloy, and an Fe—Ni alloy.

5. A method of production of a semiconductor module, comprising:

forming a resist layer on a first surface of a metal substrate;
patterning said resist layer to form a recess extending through the resist layer and exposing a portion of the surface of the metal substrate at which an external connection terminal pad is to be formed;
electroplating the surface portion of the metal substrate exposed through the corresponding recess to form successive metal layers thereon including a first metal layer, of a metal soluble in an etching solution which etches said metal substrate, and a final metal layer, formed of a metal insoluble in said etching solution and serving as the external connection terminal pad;
removing said resist layer;
placing a semiconductor chip on said metal substrate and electrically connecting said semiconductor chip and said external connection terminal pad by wires;
forming a sealing resin layer sealing said semiconductor chip, said external connection terminal pad and said wires on said surface of said metal substrate; and
etching away said metal substrate and said soluble metal layer, using said etching solution, to expose a surface of said final successive metal layer, as a connection surface of said external connection terminal pad and to form a bottom surface having recesses at locations of the external connection terminal pads, the recesses being formed by etching away said soluble metal layer.

6. A method of production as set forth in claim 5, wherein said soluble metal layer is formed by the same metal as the metal of said metal substrate.

7. A method of production as set forth in claim 5, wherein said external connection terminal pad is formed by successively stacking an insoluble metal layer comprised of Au, a Pd layer, an Ni layer, and a Pd layer.

8. A method of production as set forth in claim 5, where said metal substrate is comprised of at least one material selected from the group comprised of Cu, a Cu alloy, and an Fe—Ni alloy.

* * * * *

UNITED STATES PATENT AND TRADEMARK OFFICE
CERTIFICATE OF CORRECTION

| | | |
|---|---|---|
| PATENT NO. | : 7,064,001 B2 | Page 1 of 1 |
| APPLICATION NO. | : 10/216776 | |
| DATED | : June 20, 2006 | |
| INVENTOR(S) | : Youichi Kazama et al. | |

It is certified that error appears in the above-identified patent and that said Letters Patent is hereby corrected as shown below:

Title Pg, Item (57) Abstract: Line 6, change "pds," to --pads--.

Signed and Sealed this

Third Day of April, 2007

JON W. DUDAS
*Director of the United States Patent and Trademark Office*